(12) United States Patent
Liu et al.

(10) Patent No.: US 11,862,585 B2
(45) Date of Patent: Jan. 2, 2024

(54) SEMICONDUCTOR PACKAGE STRUCTURES AND METHODS OF MANUFACTURING THE SAME

(71) Applicant: Advanced Semiconductor Engineering, Inc., Kaohsiung (TW)

(72) Inventors: Syu-Tang Liu, Kaohsiung (TW); Huang-Hsien Chang, Kaohsiung (TW); Shu-Han Yang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 686 days.

(21) Appl. No.: 16/798,164

(22) Filed: Feb. 21, 2020

(65) Prior Publication Data

US 2021/0265290 A1 Aug. 26, 2021

(51) Int. Cl.
| | | |
|---|---|---|
| *H01L 23/00* | (2006.01) | |
| *H01L 23/28* | (2006.01) | |
| *H01L 23/495* | (2006.01) | |
| *H01L 23/485* | (2006.01) | |

(Continued)

(52) U.S. Cl.
CPC .............. *H01L 24/02* (2013.01); *H01L 23/28* (2013.01); *H01L 23/485* (2013.01); *H01L 23/49503* (2013.01); *H01L 23/5385* (2013.01); *H01L 25/0655* (2013.01)

(58) Field of Classification Search
CPC .............. H01L 21/568; H01L 23/5385; H01L 25/0655; H01L 23/485; H01L 23/49503; H01L 24/18; H01L 23/3128; H01L 23/28; H01L 24/02; H01L 23/544; H01L 21/6835; H01L 25/50; H01L 23/49816; H01L 2224/24137; H01L 2224/16225; H01L 2221/68345; H01L 2924/181; H01L 2223/54466; H01L 2924/19107; H01L 2924/18161; H01L 2223/54426; H01L 2224/73204; H01L 2224/32225; H01L 2223/54453; H01L 2924/00012;
(Continued)

(56) References Cited

U.S. PATENT DOCUMENTS

| | | | | |
|---|---|---|---|---|
| 2012/0217642 A1* | 8/2012 | Sun | ........................ | H01L 25/16 257/773 |
| 2018/0138155 A1* | 5/2018 | Kim | ........................ | H01L 25/50 |
| 2018/0350745 A1* | 12/2018 | Hsieh | ...................... | H01L 24/83 |

(Continued)

FOREIGN PATENT DOCUMENTS

| | | | | |
|---|---|---|---|---|
| CN | 105552059 B | * | 6/2018 | ............. H01L 24/97 |
| EP | 2334158 A1 | * | 6/2011 | ......... H01L 23/3128 |

*Primary Examiner* — Cheung Lee
(74) *Attorney, Agent, or Firm* — FOLEY & LARDNER LLP

(57) ABSTRACT

A semiconductor package structure includes a first substrate, a second substrate, a pad layer and a conductive bonding layer. The first substrate has a first surface and a second surface opposite to the first surface. The second substrate has a first surface and a second surface opposite to the first surface. The second substrate is disposed side-by-side with the first substrate. The pad layer is disposed on the second surface of the first substrate and the second surface of the second substrate. The conductive bonding layer is disposed between the pad layer and the second surfaces of the first substrate and the second substrate.

8 Claims, 23 Drawing Sheets

(51) Int. Cl.
*H01L 23/538* (2006.01)
*H01L 25/065* (2023.01)

(58) Field of Classification Search
CPC .................. H01L 2924/00; H01L 21/56; H01L 23/49833; H01L 23/49838; H01L 24/05; H01L 24/06
USPC ........................................................ 257/773
See application file for complete search history.

(56) References Cited

U.S. PATENT DOCUMENTS

| | | | |
|---|---|---|---|
| 2021/0134724 A1* | 5/2021 | Rubin | H01L 23/5385 |
| 2021/0143119 A1* | 5/2021 | Huang | H01L 23/5386 |
| 2021/0202396 A1* | 7/2021 | Wu | H01L 23/5389 |
| 2021/0313298 A1* | 10/2021 | Archer | H01L 25/0655 |

* cited by examiner

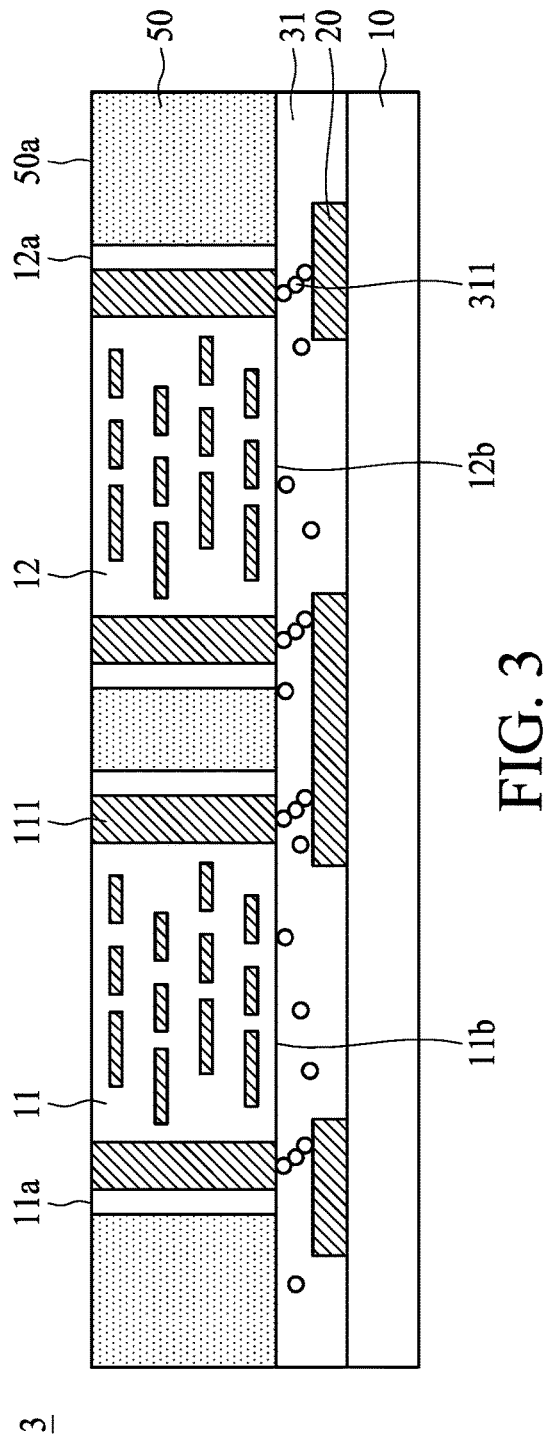
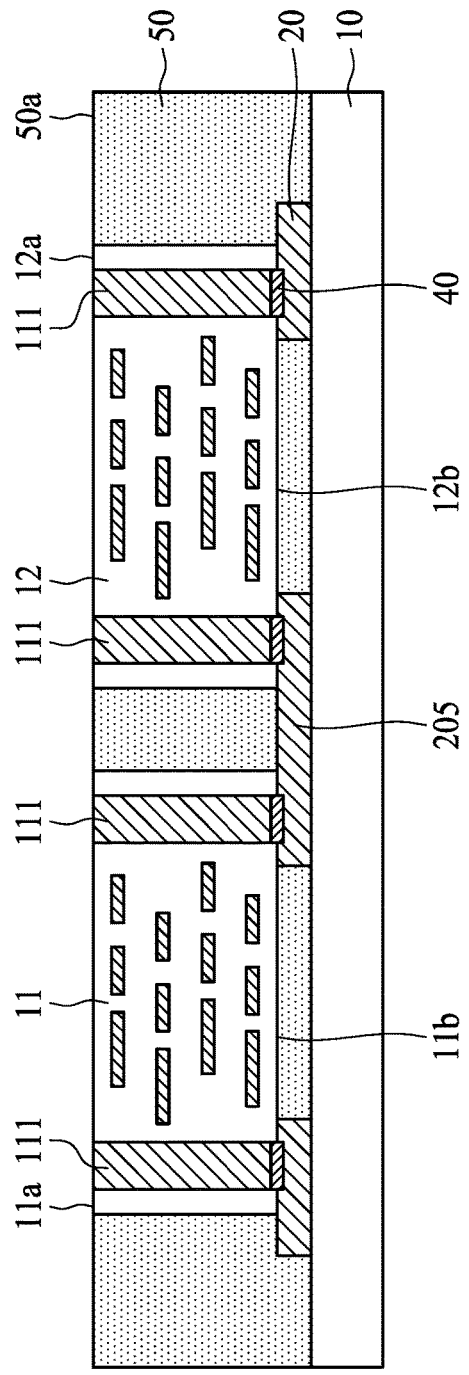

SEMICONDUCTOR PACKAGE STRUCTURES AND METHODS OF MANUFACTURING THE SAME

BACKGROUND

1. Field of the Disclosure

The present disclosure relates to semiconductor package structures and methods of manufacturing the same.

2. Description of Related Art

A semiconductor device package includes a semiconductor device attached to a substrate. Nowadays, the substrate is required to have larger surface area and more complicated electrical circuitry to install more semiconductor devices, which not only increases the complexity of the manufacture process of the substrate but also reduces the yield of the substrate.

SUMMARY

According to some embodiments of the present disclosure, a semiconductor package structure includes a first substrate, a second substrate, a pad layer and a conductive bonding layer. The first substrate has a first surface and a second surface opposite to the first surface. The second substrate has a first surface and a second surface opposite to the first surface. The second substrate is disposed side-by-side with the first substrate. The pad layer is disposed on the second surface of the first substrate and the second surface of the second substrate. The conductive bonding layer is disposed between the pad layer and the second surfaces of the first substrate and the second substrate.

According to some embodiments of the present disclosure, a semiconductor package structure includes a first substrate, a second substrate and a pad layer. The first substrate has a first surface and a second surface opposite to the first surface. The second substrate has a first surface and a second surface opposite to the first surface. The second substrate is disposed side-by-side with the first substrate. The first surface and the second surface of the first substrate and the first surface and the second surface of the second substrate include conductive traces. A line width and line space (L/S) of the first surface of the first substrate is less than an L/S of the second surface of the first substrate. An L/S of the first surface of the second substrate is less than an L/S of the second surface of the second substrate. The pad layer is disposed on the second surface of the first substrate and the second surface of the second substrate. The pad layer is electrically connected to the first substrate and the second substrate.

According to some embodiments of the present disclosure, a method of manufacturing a semiconductor package structure includes: providing a carrier having a pad layer on a top surface of the carrier; bonding a first substrate and a second substrate to the pad layer; and providing an encapsulant covering the first substrate and a second substrate.

BRIEF DESCRIPTION OF THE DRAWINGS

Aspects of the present disclosure are readily understood from the following detailed description when read with the accompanying figures. It should be noted that various features may not be drawn to scale, and the dimensions of the various features may be arbitrarily increased or reduced for clarity of discussion.

FIG. 3 is a cross-sectional view of a semiconductor package structure in accordance with some embodiments of the present disclosure.

FIG. 4 is a cross-sectional view of a semiconductor package structure in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
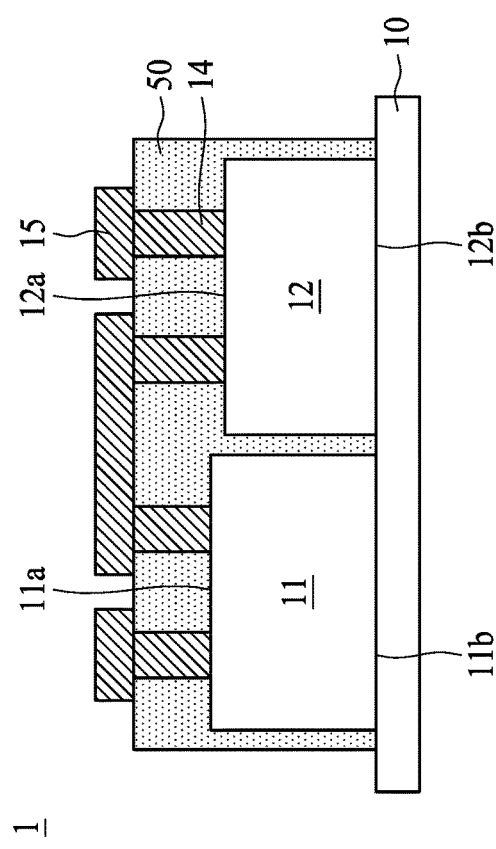
FIG. 1 is a cross-sectional view of a semiconductor package structure in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation or disposal of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Due to the demand for electronic devices with high performance and multifunction, a semiconductor package substrate is required to have larger surface area and more complicated electrical circuitry to install more semiconductor devices. The size of the semiconductor substrate becomes larger while the yield decreases. Partitioned substrates, which collectively provide a complete circuit function as a single semiconductor package substrate, are smaller in size and easier to produce than the semiconductor package substrate, and therefore, they may be used to replace a large-size semiconductor package substrate in many applications.

FIG. 1 is a cross-sectional view of a semiconductor package structure 1 in accordance with some embodiments of the present disclosure. The semiconductor package structure 1 includes a first substrate 11 and a second substrate 12. The first substrate 11 and the second substrate 12 may be partitioned substrates each of which includes circuit with incomplete function. The first substrate 11 has a first surface 11a and a second surface 11b opposite to the first surface 11a. The second substrate 12 has a first surface 12a and a second surface 12b opposite to the first surface 12a. The first surface 11a and 12a may be electrically connected a semiconductor chip or die and thus may be referred to as "chip side" or "chip-side surface." The second surface 11b and 12b may be electrically connected a solder ball or bump and thus may be referred to as "ball side" or "ball-side surface." The first surface 11a may include conductive traces having an L/S less than an L/S of the conductive traces of the second surface 11b. The first surface 12a may include conductive traces having an L/S less than an L/S of the conductive traces of the second surface 12b. Though not shown in FIG. 1, the first substrate 11 and the second substrate 12 may have one or more embedded circuit layers 112 and/or conductive vias 111 as illustrated in FIG. 2.

In the manufacture process of the semiconductor package structure 1, the first substrate 11 and the second substrate 12 may be disposed on a carrier 10. The carrier 10 may be removed after the manufacture of the semiconductor package structure 1. The first surface 11a of the first substrate 11 and the first surface 12a of the second substrate 12 face away the carrier 10. An encapsulant 50 is disposed on the carrier 10 and covers the first surface 11a of the first substrate 11 and the first surface 12a of the second substrate 12. A conductive layer 15, which may include pads and/or conductive traces, is disposed on the encapsulant 50 and may be electrically connected to a semiconductor chip or die (not shown). Conductive pillars 14 are disposed within the encapsulant 50 to electrically connect the first substrate 11 and the second substrate 12 to the conductive layer 15. The first substrate 11 and the second substrate 12 may be electrically connected to each other through the conductive pillars 14 and the conductive layer 15 to provide a complete circuit function as required. However, the position of the first substrate 11 and the second substrate 12 may be shifted during the filling of a molding compound for preparing the encapsulant 50, and therefore, the conductive pillars 14 may not be precisely connected to the first surfaces 11a and 12a. In addition, the ball pads (not shown) on the second surfaces 11b and 12b may not be precisely connected to a printed circuit board (PCB). In addition, tall conductive pillars increases the length of electrical path and the electrical performance of the semiconductor package structure 1 may be deteriorated.

The present disclosure provides a semiconductor package structure including two or more substrates disposed side-by-side. The substrates may be partitioned substrates and are electrically connected to each other through a pad layer without the use of conductive pillars. As compared to the embodiments in accordance with FIG. 1, since it is unnecessary to form conductive pillars, a distance of two adjacent substrates can be reduced. In some embodiments (especially those illustrated in FIG. 2, FIG. 3, FIG. 4, FIG. 5 and FIG. 6), the pad layer is pre-formed on a carrier and the pads of the pad layer function as alignment marks so the substrates can be disposed on the pad layer precisely. In some embodiments, the semiconductor package structure includes a conductive bonding layer or structure which is helpful to fix the position of the substrates, and therefore, the position shift of the substrates due to the filling of an encapsulant can be further improved.

Figure 2:
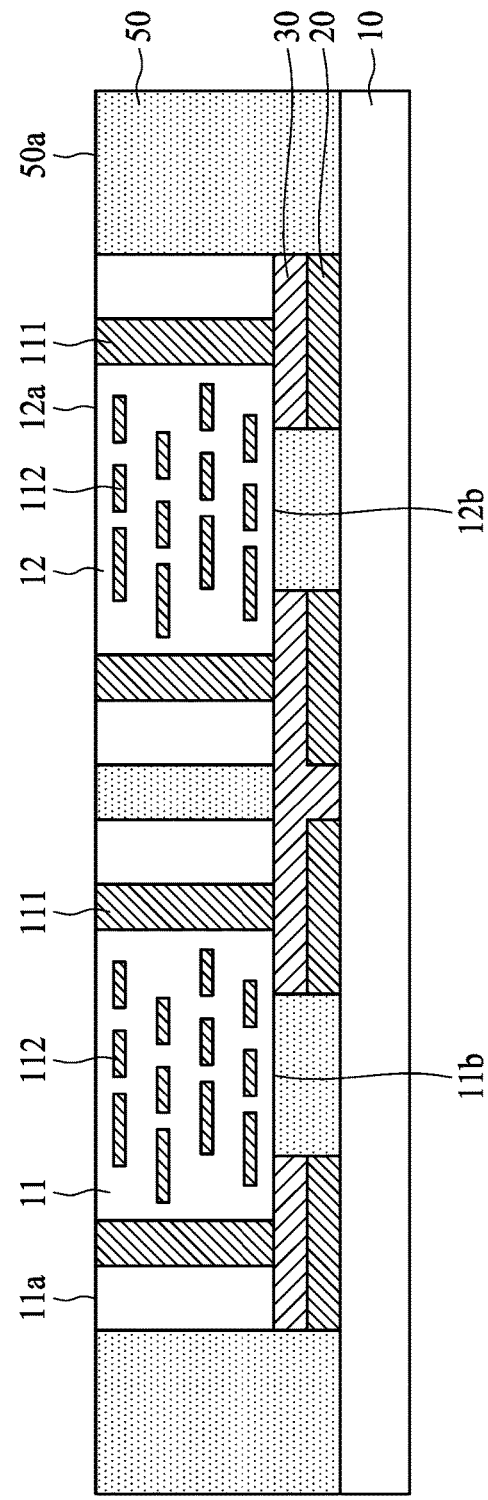
FIG. 2 is a cross-sectional view of a semiconductor package structure in accordance with some embodiments of the present disclosure.

FIG. 2 is a cross-sectional view of a semiconductor package structure 2 in accordance with some embodiments of the present disclosure. The semiconductor package structure 2 includes a first substrate 11, a second substrate 12 and a pad layer 20. The second substrate 12 is disposed side-by-side with the first substrate 11 on a carrier 10. The carrier may be removed after the manufacture of the semiconductor package structure 2.

The first substrate 11 and the second substrate 12 may be partitioned substrates each of which includes circuit with incomplete function. The first substrate 11 has a first surface 11a and a second surface 11b opposite to the first surface 11a. The second substrate 12 has a first surface 12a and a second surface 12b opposite to the first surface 12a. The first surface 11a and 12a may be electrically connected a semiconductor chip or die and thus may be referred to as "chip side" or "chip-side surface." The second surface 11b and 12b may be electrically connected a solder ball or bump and thus may be referred to as "ball side" or "ball-side surface." The first surface 11a may include conductive traces having an L/S less than an L/S of the conductive traces of the second surface 11b. The first surface 12a may include conductive traces having an L/S less than an L/S of the conductive traces of the second surface 12b. The first substrate 11 and the second substrate 12 may have one or more embedded circuit layers 112, conductive vias (e.g., through vias 111), pads or contacts. The circuit layers, conductive vias, pads or contacts may be made of nickel, copper, gold, platinum or other suitable metal or alloy.

The pad layer 20 includes a plurality of pads and is disposed on the second surface 11b of the first substrate 11 and the second surface 12b of the second substrate 12. A conductive bonding layer or structure 30 is disposed between the pad layer 20 and the second surface 11b of the first substrate 11 and the second surface 12b of the second substrate 12. In some embodiments, the conductive bonding layer or structure 30 is in contact with the pad layer 20, the first substrate 11 and the second substrate 12, and more specifically, the conductive bonding layer or structure 30 is in direct contact with the pad layer 20 and the second surfaces 11b and 12b of the first substrate 11 and the second substrate 12. In some embodiments, the pad layer 20 is bonded and electrically connected to the second surface 11b of the first substrate 11 and the second surface 12b of the second substrate 12 through the conductive bonding layer or structure 30. The first substrate 11 and the second substrate 12 may be electrically connected to each other through the pad layer 20 and the conductive bonding layer or structure 30 to provide a complete circuit function as required. The pad layer 20 may be made of nickel, copper, gold, platinum or other suitable metal or alloy. The conductive bonding layer or structure 30 may be, or include, a solder. The conductive bonding layer or structure 30 may be formed by applying a solder paste or solder material on the pads of the pad layer 20. During the reflow process, self-alignment of the solder paste or solder material occurs, and therefore, the alignment of the substrates to the pad layer can be further improved.

The semiconductor package structure 1 may further include an encapsulant 50. The encapsulant 50 encloses or covers the first substrate 11, the second substrate 12 and the pad layer 20. In some embodiments, the first surface 11a of the first substrate 11 and the first surface 12a of the second substrate 12 may be exposed from a surface 50a of the encapsulant 50 and electrically connected to a semiconductor die or chip (not shown). In some embodiments, the pads of the pad layer 20 may be exposed from a surface of the encapsulant 50 opposite to the surface 50a and electrically connected to a PCB.

FIG. 3 is a cross-sectional view of a semiconductor package structure 3 in accordance with some embodiments of the present disclosure. The semiconductor package structure 3 has a similar structure to that of the semiconductor package structure 2 of FIG. 2 except the conductive bonding layer or structure. In the embodiments illustrated in FIG. 3, the conductive bonding layer or structure 31 may be or include an anisotropic conductive film (ACF), an anisotropic conductive adhesive (ACA) or an anisotropic conductive paste (ACP) which provides unidirectional electrical conductivity in the vertical direction and insulation in the horizontal direction via conductive particles 311.

FIG. 4 is a cross-sectional view of a semiconductor package structure 4 in accordance with some embodiments of the present disclosure. The semiconductor package structure 4 has a similar structure to that of the semiconductor package structure 2 of FIG. 2 except the conductive bonding layer or structure. In the embodiments illustrated in FIG. 4, the conductive bonding layer or structure may be a metal layer or an intermetallic layer 40 or the conductive bonding layer or structure may include a part of the pad layer.

In the manufacture process of the semiconductor package structure 4, the first substrate 11 and the second substrate 12 is disposed on the pad layer 20 and the conductive vias 111 (or pads or electrical contacts) of the first substrate 11 and the second substrate 12 are in direct contact with the pad layer 20. The pad layer 20 and the conductive vias 111 (or pads or electrical contacts) of the first substrate 11 and the second substrate 12 may be made of the same material or different material.

In some embodiments, for example, those illustrated in FIG. 4, the pad layer 20 and the conductive vias 111 (or pads or electrical contacts) of the first substrate 11 and the second substrate 12 form a metal layer or an intermetallic layer or at a contact surface (i.e., interface) therebetween. The metal layer or intermetallic layer 40 may result from, for example, the reaction occurring at the interface or the migration of atoms from the pad layer 20 and/or the conductive vias 111. The metal layer or intermetallic layer 40 enhances the adhesion of the pad layer and the conductive vias (or pads or electrical contacts) of the first and second substrate.

In some embodiments, there is no visible intermetallic layer or metal layer at the contact surface and the pad layer is directly bonded to the conductive vias (or pads or electrical contacts) without additional bonding material including a solder, an ACF, an ACA or ACP. In these embodiments, the pad layer per se functions as a conductive bonding layer, or a part of the pad layer which is adjacent to the contact surface between the pad layer and the conductive vias (or pads or electrical contacts) of the first and second substrates may be viewed as a conductive bonding layer.

The bonding of the pad layer to the conductive vias (or pads or electrical contacts) may be implemented by metal-to-metal bonding techniques. In some embodiments, the pad layer and the conductive vias (or pads or electrical contacts) are made of copper and Cu-to-Cu bonding technique are adopted to bond the pad layer to the conductive vias (or pads or electrical contacts).

As illustrated in FIG. 4, the plurality of pads the pad layer 20 includes a pad 205 in contact with the second surfaces 11b and 12b of the first substrate 11 and the second substrate 12, and therefore, the first substrate 11 can be electrically connected to the second substrate 12 through the pad layer 20.

Figure 5:
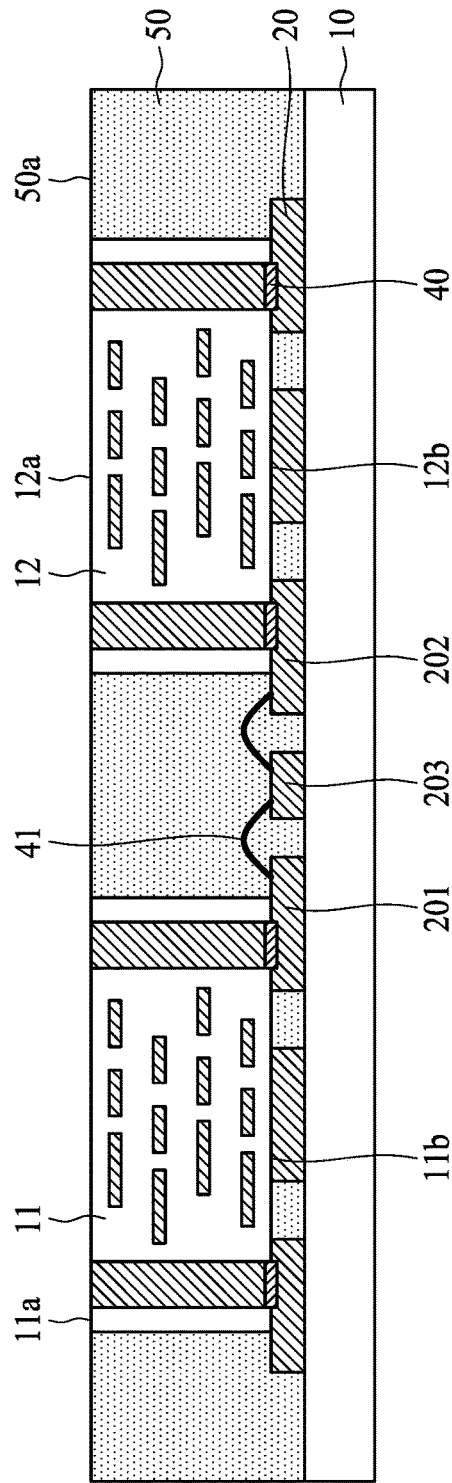
FIG. 5 is a cross-sectional view of a semiconductor package structure in accordance with some embodiments of the present disclosure.

FIG. 5 is a cross-sectional view of a semiconductor package structure 5 in accordance with some embodiments of the present disclosure. The semiconductor package structure 5 has a similar structure to that of the semiconductor package structure 4 of FIG. 4 except that the pad layer 20 of the semiconductor package structure 5 does not include a pad connecting both of the second surfaces 11b and 12b.

In the embodiments illustrated in FIG. 5, the plurality of the pads of the pad layer 20 includes a first pad 201 in direct contact with the second surface 11b of the first substrate 11 and a second pad 202 in direct contact with the second surface 12b of the second substrate 12. The pad layer 20 may further include a third pad 203. The semiconductor package structure may include one or more wires 41. The first pad 201 and the second pad 202 may be connected to each other through the wire 41, and therefore, the first substrate 11 can be electrically connected to the second substrate 12 through the pad layer 20 and the wire 41. In some embodiments, the first pad 201 and the second pad 202 may be electrically connected to each other via a single wire. In some embodiments, the first pad 201 and the second pad 202 may be electrically connected to each other by two or more wires, for example, by a wire connecting to the first pad 201 and the third pad 203 and a wire connecting to the second pad 202 and the third pad 203.

In some other embodiments, the first pad 201 and the second pad 202 may be electrically connected to each other by conductive traces of the pad layer 20 instead of the wire 41.

Figure 6:
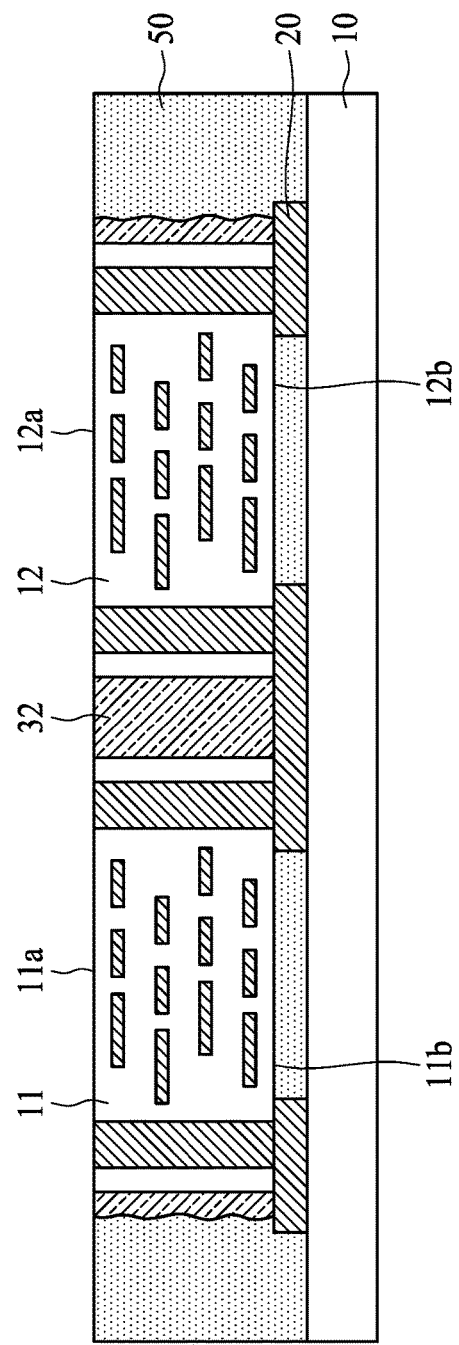
FIG. 6 is a cross-sectional view of a semiconductor package structure in accordance with some embodiments of the present disclosure.

FIG. 6 is a cross-sectional view of a semiconductor package structure 6 in accordance with some embodiments of the present disclosure. The semiconductor package structure 6 includes a first substrate 11, a second substrate 12 and a pad layer 20. The second substrate 12 is disposed side-by-side with the first substrate 11 on a carrier 10. The carrier may be removed after the manufacture of the semiconductor package structure 2. The pad layer 20 is disposed on the second surface 11b of the first substrate 11 and the second surface 12b of the second substrate 12. The pad layer 20 is electrically connected to the first substrate 11 and the second substrate 20.

As showed in FIG. 6, a lateral surface of the first substrate 11 includes a vertical recess extending from the first surface 11a to the second surface 11b and a lateral surface of the first substrate 12 includes a vertical recess extending from the first surface 12a to the second surface 12b. A solder is filled within the vertical recess. In some embodiments, a solder in a vertical recess of the first substrate 11 can be combined with another solder in a vertical recess of the second substrate 12 adjacent to the vertical recess of the first substrate 11 and forms a conductive bonding structure 32. The conductive bonding structure 32 is in contact with the pad layer 20, the first substrate 11 and the second substrate 12 and can enhance the adhesion therebetween. As a result, the position of the first substrate and the second substrate can be further secured. Other details of the first substrate 11 and second substrate 12 have been discussed above with respect to the embodiments illustrated in FIG. 2.

The semiconductor package structure 6 may further include an encapsulant 50. The encapsulant 50 encloses or covers the first substrate 11, the second substrate 12 and the pad layer 20. In some embodiments, the first surface 11a of the first substrate 11a and the first surface 12a of the second substrate 12 may be exposed from a surface 50a of the encapsulant 50 and electrically connected to a semiconductor die or chip (not shown). In some embodiments, the pads of the pad layer 20 may be exposed from a surface opposite to the surface 50a of the encapsulant 50 and electrically connected to a PCB.

Figure 7:
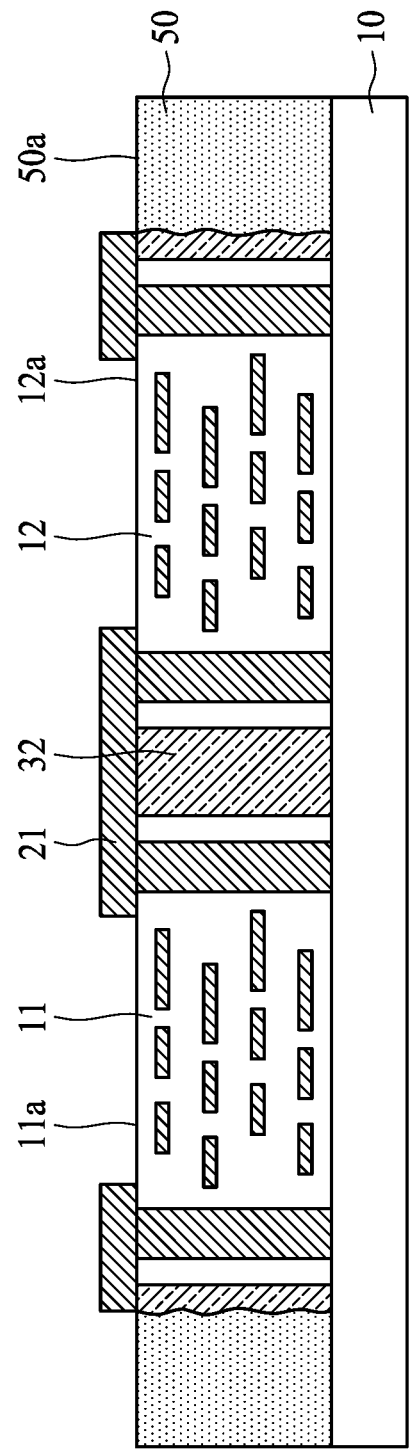
FIG. 7 is a cross-sectional view of a semiconductor package structure in accordance with some embodiments of the present disclosure.

FIG. 7 is a cross-sectional view of a semiconductor package structure 7 in accordance with some embodiments of the present disclosure. The semiconductor package structure 7 has a similar structure to that of the semiconductor package structure 6 of FIG. 6 except that the pad layer 21 of the semiconductor package structure 7 is disposed on the first surfaces 11a and 12a of the first substrate 11 and the second substrate 12.

Figure 8:
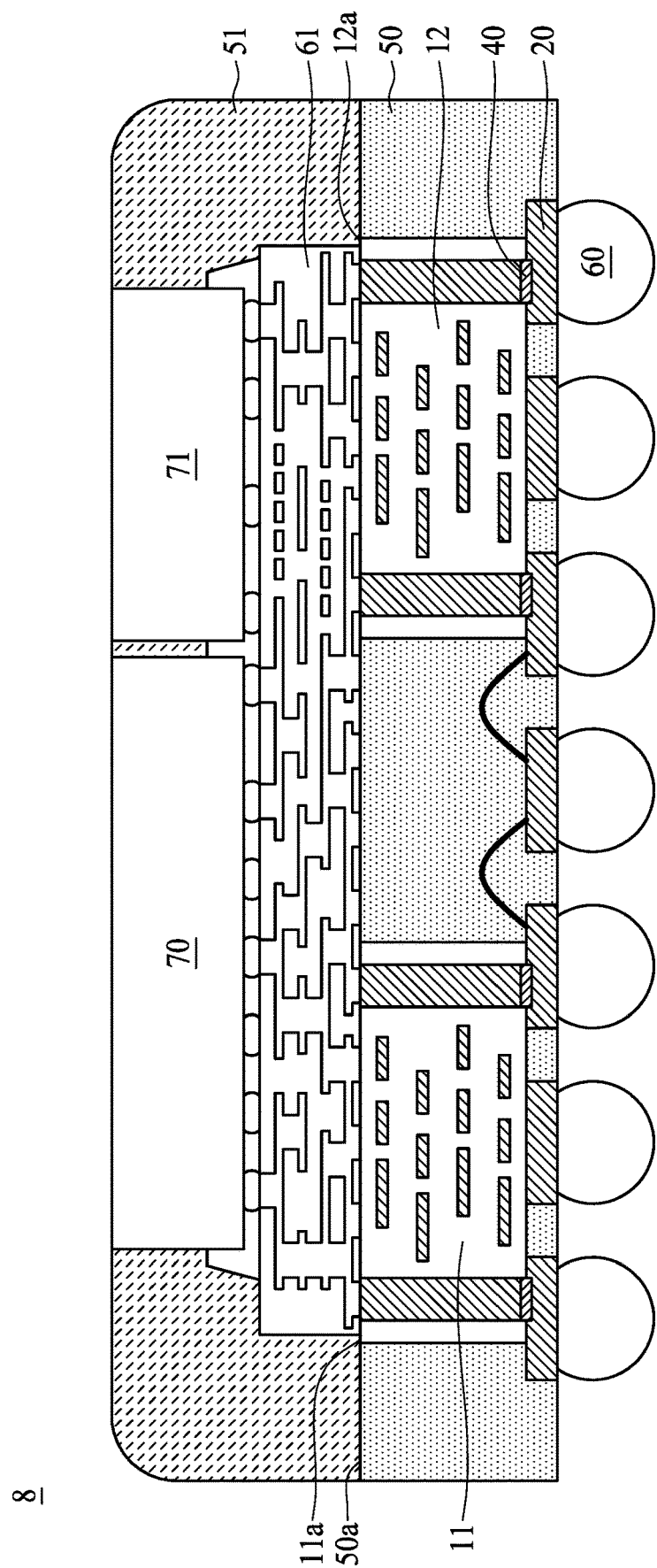
FIG. 8 is a cross-sectional view of a semiconductor package structure in accordance with some embodiments of the present disclosure.

FIG. 8 is a cross-sectional view of a semiconductor package structure 8 in accordance with some embodiments of the present disclosure. In addition to the first substrate 11, the second substrate 12, the pad layer 20 and the encapsulant 50 which have been discussed above, the semiconductor package structure 8 further includes a redistribution layer (RDL) structure 61, one or more electronic devices 70 and 71, and a plurality of solder balls 60.

The RDL structure 61 is disposed on the first surface 11a of the first substrate 11 and the first surface 12a of the second substrate 12. The RDL structure 61 may include one or more redistribution layers and insulation material(s) or dielectric material(s) encapsulating the one or more redistribution layers. The RDL structure 61 may include conductive trace(s), pad(s), contact(s) and/or via(s) for electrical connection.

The electronic devices 70 and 71 are disposed on the RDL structure 61 and electrically connected to the first substrate 11 or the second substrate 12 through the RDL structure 61. A further encapsulant 51 is provided to encapsulate or cover the electronic devices 70 and 71 and the RDL structure 61.

FIG. 9A, FIG. 9B, FIG. 9C, FIG. 9D and FIG. 9E illustrate various stages of a method for manufacturing a semiconductor package structure 2 in accordance with some embodiments of the present disclosure.

Figure 9A:
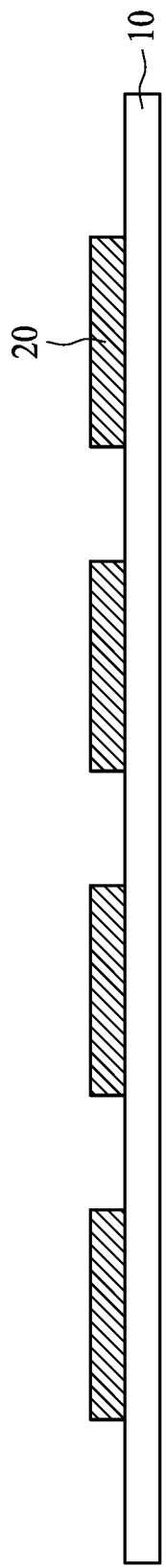
FIG. 9A, FIG. 9B, FIG. 9C, FIG. 9D, FIGS. 9E and 9F illustrate various stages of a method for manufacturing a semiconductor package structure in accordance with some embodiments of the present disclosure.

Referring to FIG. 9A, a carrier 10 is provided. A patterned metal layer is formed on the carrier 10. The patterned metal layer 20 includes a plurality of pads. In some embodiments, the patterned metal layer 20 is an redistribution layer (RDL) which includes conductive traces and a plurality of pads. The patterned metal layer 20 is referred to as a pad layer in the embodiments of the present disclosure.

Figure 9B:
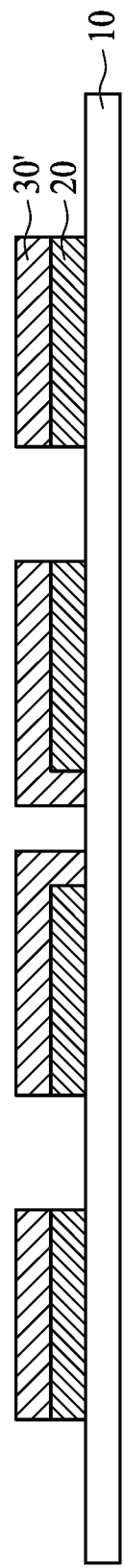

Referring to FIG. 9B, a solder 30' is disposed on the pad layer 20 and covers a respective pad of the pad layer 20.

Figure 9C:
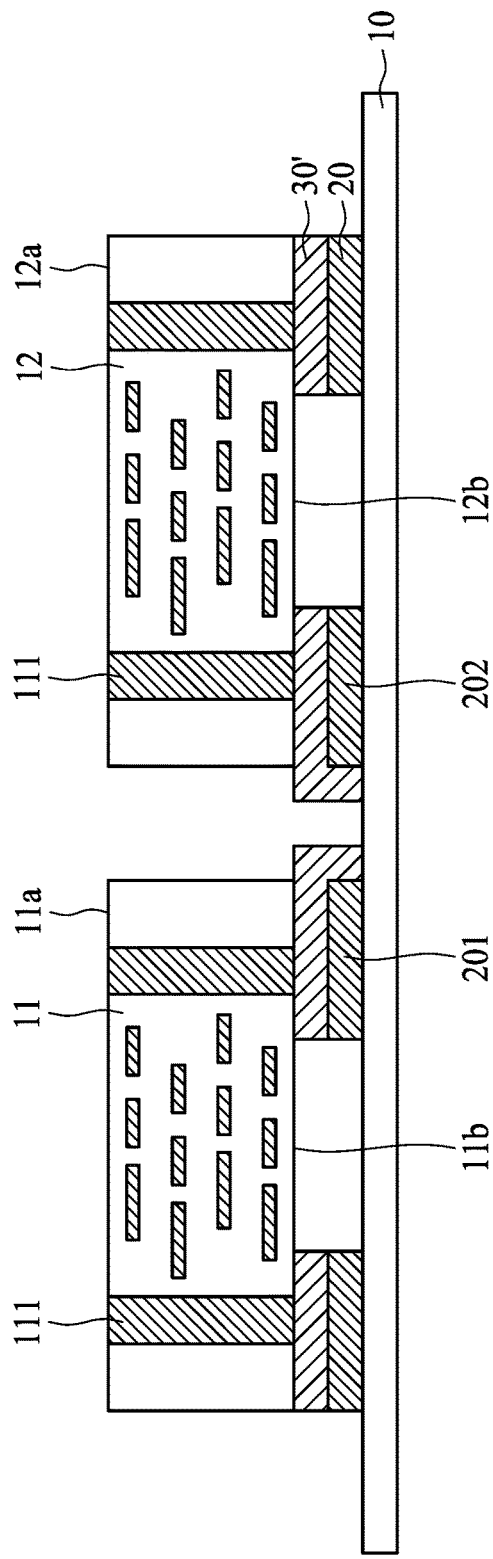

Referring to FIG. 9C, a first substrate 21 and a second substrate 22 are singulated from one or more mother substrates. In some embodiments, the first substrate 21 and the second substrate 22 are partitioned substrates each of which includes circuit with incomplete function. The first substrate 11 has a first surface 11a and a second surface 11b opposite to the first surface 11a. The second substrate 12 has a first surface 12a and a second surface 12b opposite to the first surface 12a. The first substrate 21 and the second substrate 22 are disposed side-by side on the solder 30'. The conductive via 111 (or the pad or electrical contact) exposed from the second surfaces 11b and 12b of the first substrate 11 and the second substrate 12 contacts the solder 30'. The pad 201 of the pad layer 20 is connected to the first substrate 11 through the solder 30' located between the pad 201 and the first substrate 11 and the pad 202 of the pad layer 20 is connected to the second substrate 12 through the solder 30' located between the pad 202 and the second substrate 12. Since the pad layer 20 is pre-formed on the carrier 10, the pads of the pad layer 20 function as alignment marks so the first substrate 21 and the second substrate 22 can be disposed on the pad layer precisely.

Figure 9D:
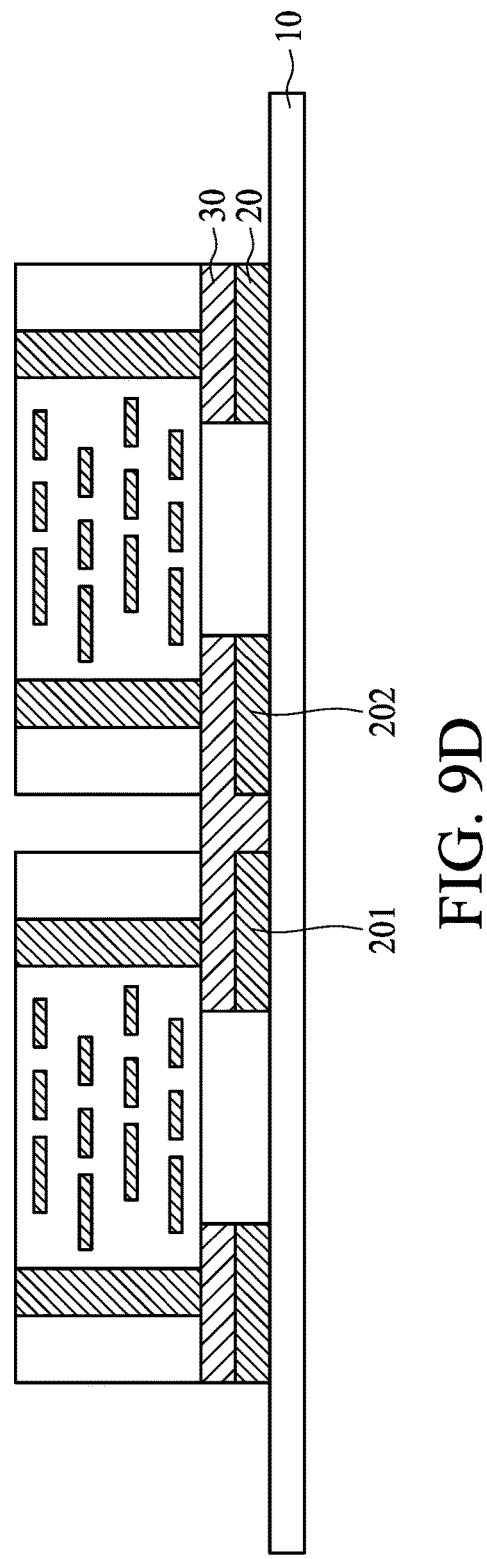

Referring to FIG. 9D, a reflow process is carried to form a conductive bonding layer 30 from the solder 30'. In addition, since the distance between the pad 201 and the pad 202 is relatively small, the solder 30' on the pad 201 and the solder 30' on the pad 202 can be melted and combine with each other during the reflow process so that the first substrate 11 can be electrically connected to the second substrate 12 through the pad layer 20 and the conductive bonding layer 30. During the reflow process, self-alignment of the solder 30' occurs, and therefore, the alignment of the first substrate 21 and the second substrate 22 to the pad layer 20 can be further improved.

Figure 9E:
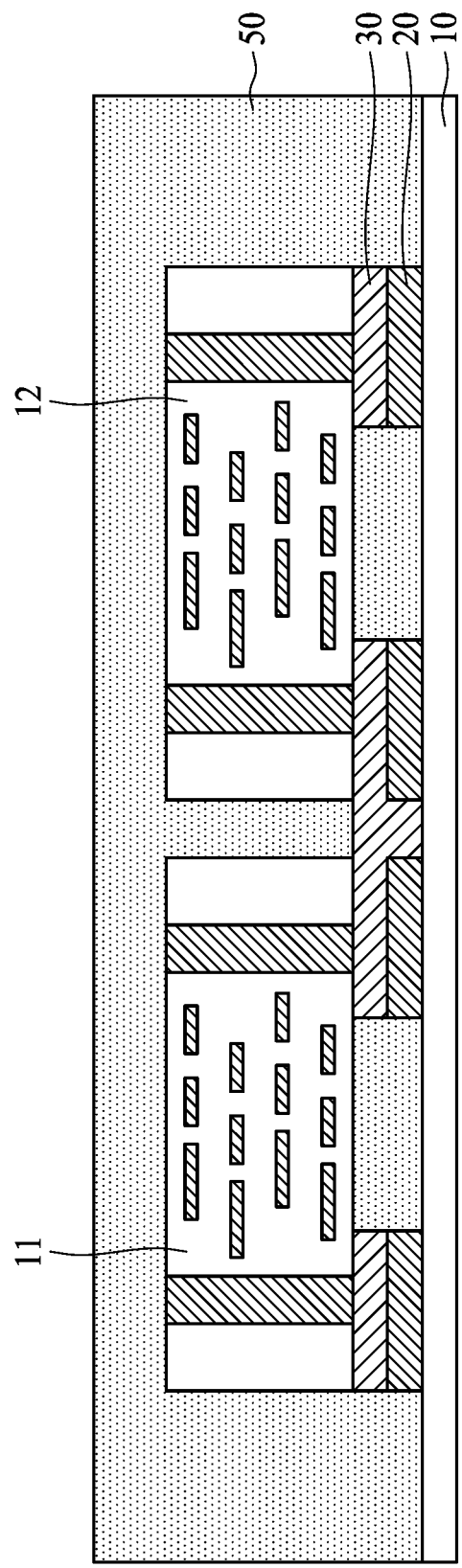

Referring to FIG. 9E, an encapsulant 50 is formed on the carrier 10 and encapsulates the first substrate 11 and the second substrate 12 by filling an encapsulant material (e.g., a molding compound). The encapsulant 50 also encapsulates the pad layer 20 and the conductive bonding layer 30. In this step, since the conductive bonding layer 30 is formed prior to the filling of the encapsulant material and can effectively fix the position of the first substrate 21 and the second substrate 22, the position shift issue can be further improved.

Figure 9F:
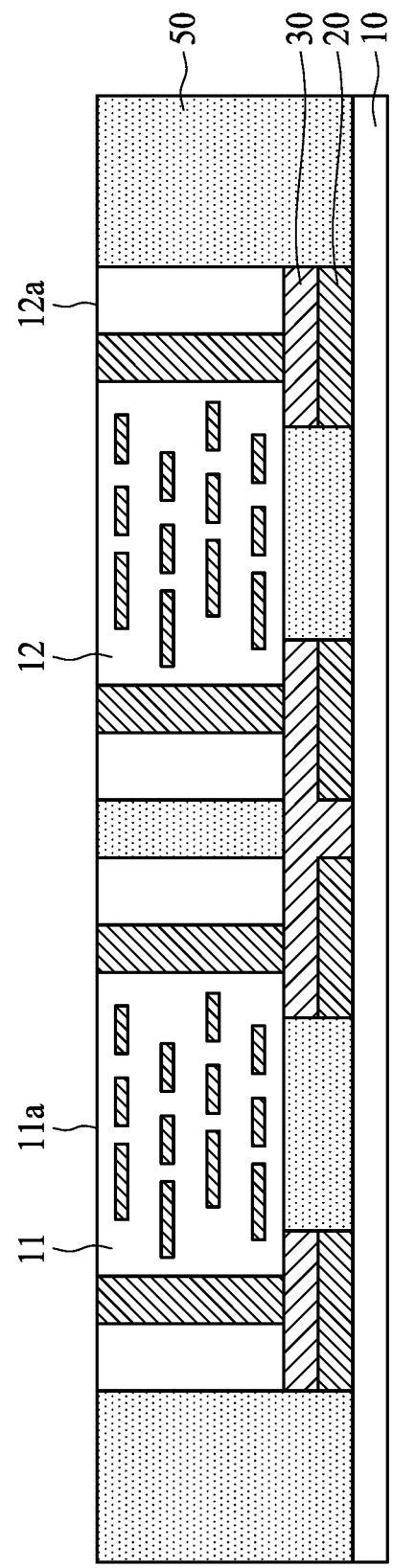

Referring to FIG. 9F, the encapsulant 50 is ground to expose the first surfaces 11a and 12a of the first substrate 11 and the second substrate 12.

FIG. 10A, FIG. 10B, FIG. 10C, FIG. 10D and FIG. 10E illustrate various stages of a method for manufacturing a semiconductor package structure 3 in accordance with some embodiments of the present disclosure.

Figure 10A:
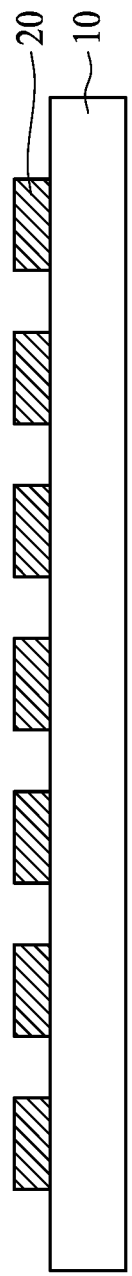
FIG. 10A, FIG. 10B, FIG. 10C, FIG. 10D and FIG. 10E illustrate various stages of a method for manufacturing a semiconductor package structure in accordance with some embodiments of the present disclosure.

Referring to FIG. 10A, a pad layer 20 is formed on a carrier 10 as illustrated in FIG. 9A.

Figure 10B:
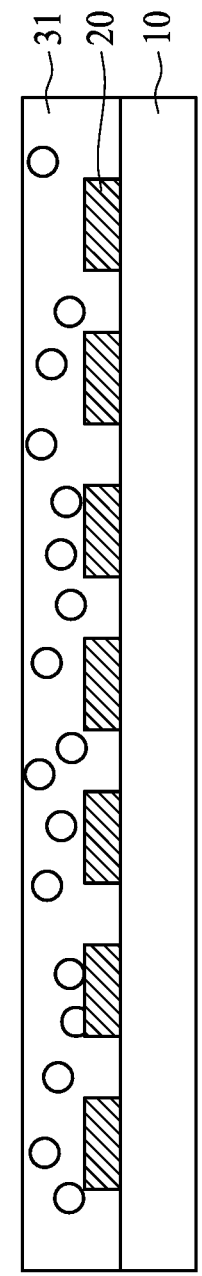

Referring to FIG. 10B, a conductive bonding layer 31 is formed by applying an anisotropic conductive film (ACF), an anisotropic conductive adhesive (ACA) or an anisotropic conductive paste (ACP) on the carrier 10. The conductive bonding layer 30 covers the pad layer 20.

Figure 10C:
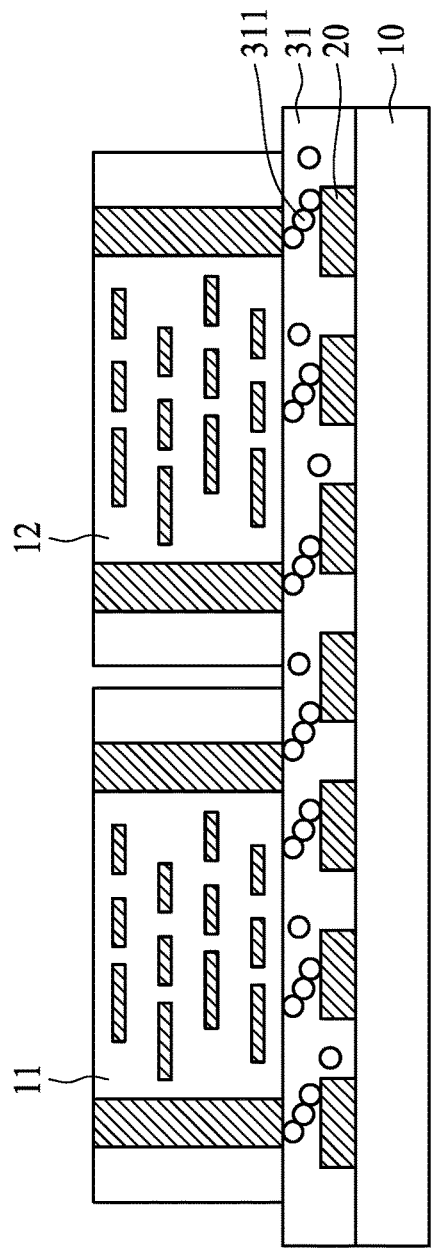

Referring to FIG. 10C, a first substrate 21 and a second substrate 22 are disposed side-by-side on the conductive bonding layer 31. The first substrate 11 can be electrically connected to the second substrate 12 through the pad layer 20 and the conductive bonding layer 31. The conductive particles 311 are connected with each other to provide unidirectional electrical conductivity in the vertical direction.

Figure 10D:
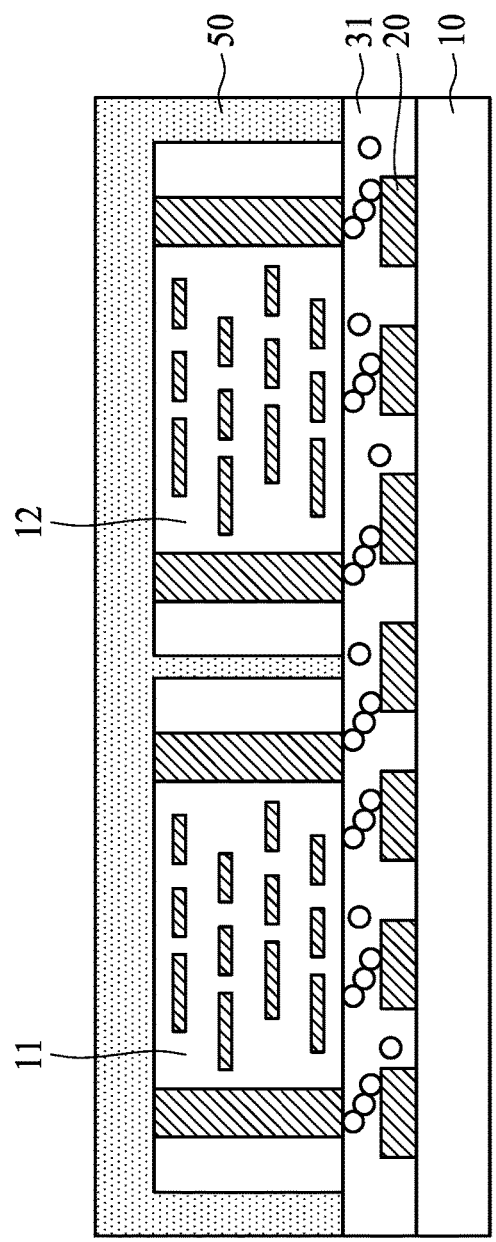

Referring to FIG. 10D, an encapsulant 50 is formed on the carrier 10 and encapsulates the first substrate 11 and the second substrate 12. The encapsulant 50 also encapsulates the pad layer 20 and the conductive bonding layer 31.

Figure 10E:
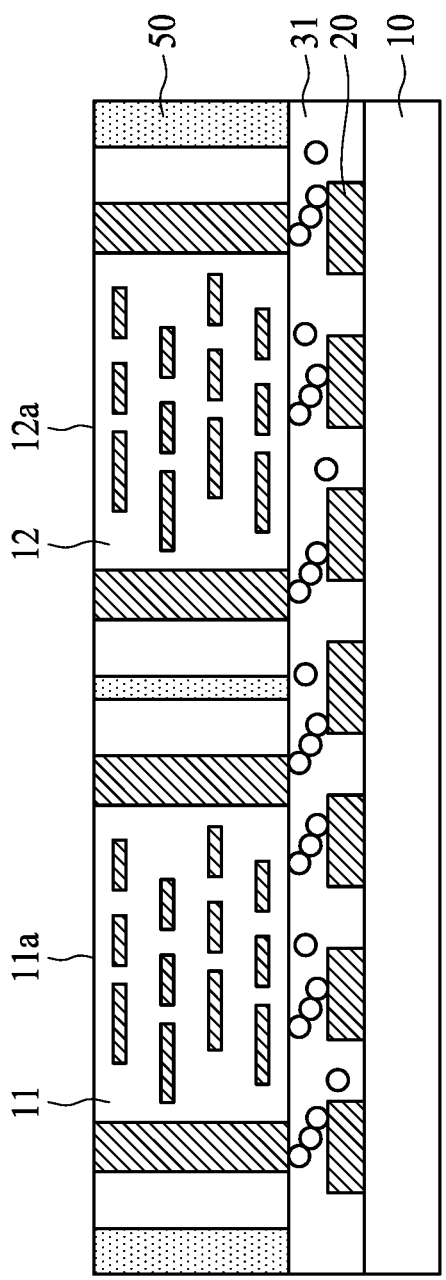

Referring to FIG. 10E, the encapsulant 50 is ground to expose the first surfaces 11a and 12a of the first substrate 11 and the second substrate 12.

Figure 11A:
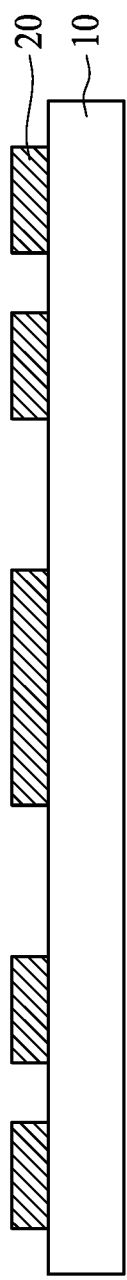
FIG. 11A, FIG. 11B and FIG. 11C illustrate various stages of a method for manufacturing a semiconductor package structure in accordance with some embodiments of the present disclosure.
Figure 11B:
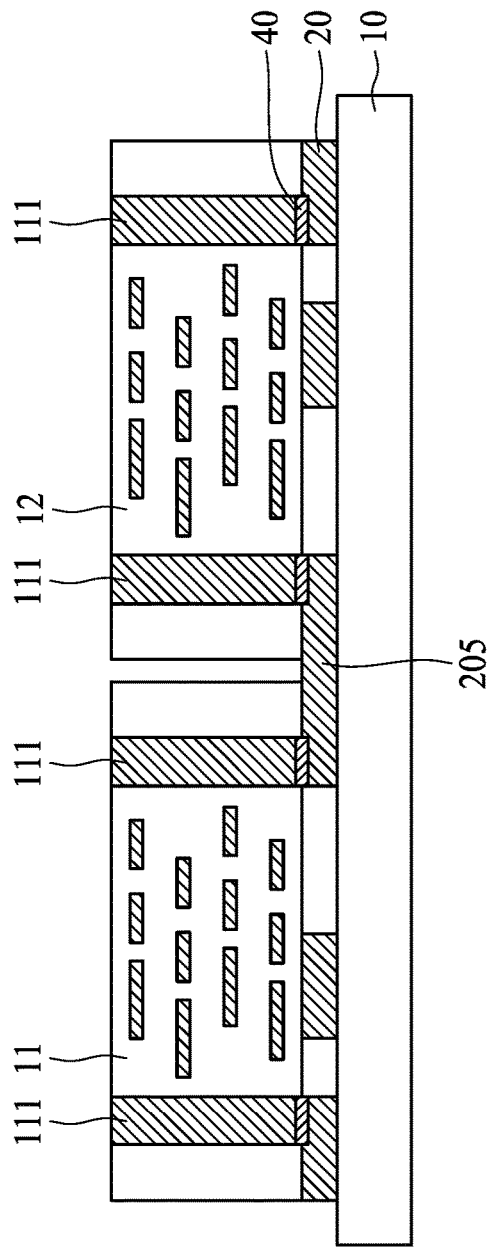
Figure 11C:
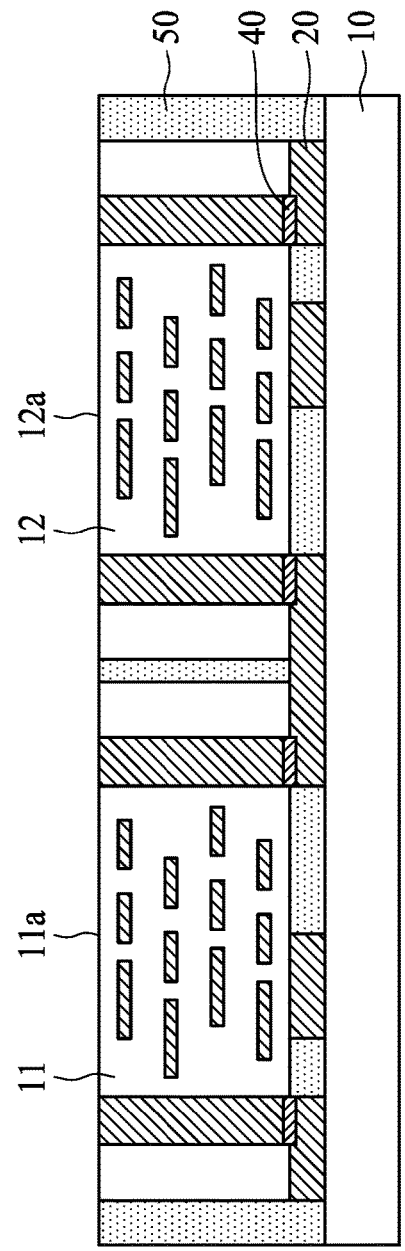

FIG. 11A, FIG. 11B and FIG. 11C illustrate various stages of a method for manufacturing a semiconductor package structure 4 in accordance with some embodiments of the present disclosure.

Referring to FIG. 11A, a pad layer 20 is formed on a carrier 10 as illustrated in FIG. 9A.

Referring to FIG. 11B, a first substrate 21 and a second substrate 22 are disposed side-by-side on the pad layer 20. The conductive vias 111 (or the pads or electrical contacts) of the first substrate 11 and the second substrate 12 are in direct contact with the pad layer 20 where a pad 205 of the pad layer 20 is in direct contact with the second surfaces 11b and 12b of the first substrate 11 and the second substrate 12 to electrically connect the first substrate 11 to the second substrate 12. The contact of the conductive vias 111 (or the pads or electrical contacts) and the the pad layer 20 are carried out by metal-to-metal bonding techniques. In some embodiments, there is a metal layer or intermetallic layer 40 formed at the interface during the operation of metal-to-metal bonding.

Referring to FIG. 11C, an encapsulant 50 is formed on the carrier 10 and encapsulates the first substrate 11, the second substrate 12 and the pad layer 20. In addition, the encapsulant 50 is ground to expose the first surfaces 11a and 12a of the first substrate 11 and the second substrate 12.

FIG. 12A, FIG. 12B, FIG. 12C, FIG. 12D, FIG. 12E, FIG. 12F and FIG. 12G illustrate various stages of a method for manufacturing a semiconductor package structure 7 in accordance with some embodiments of the present disclosure.

Figure 12A:
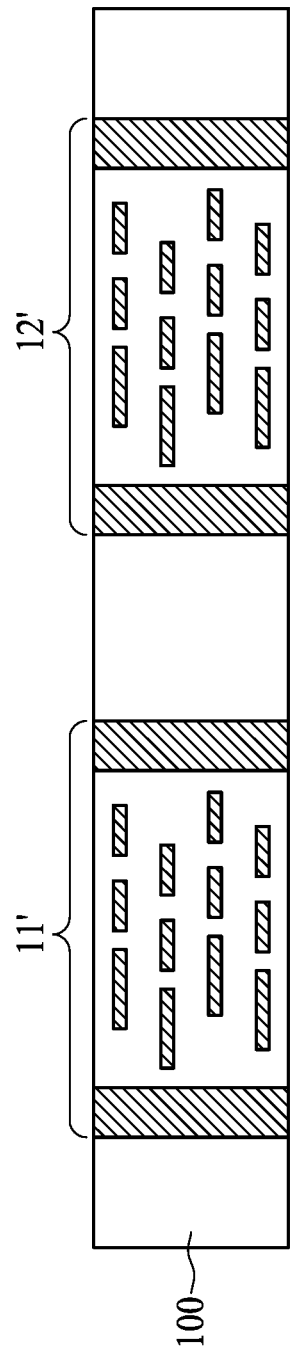
FIG. 12A, FIG. 12B, FIG. 12C, FIG. 12D, FIG. 12E, FIG. 12F, FIG. 12G, FIG. 12H, FIG. 12I and FIG. 12J illustrate various stages of a method for manufacturing a semiconductor package structure in accordance with some embodiments of the present disclosure.

Referring to FIG. 12A, a substrate 11 is provided. The substrate 11 includes substrate units 11' and 12'. The substrate units 11' and 12' may include a circuit with incomplete function.

Figure 12B:
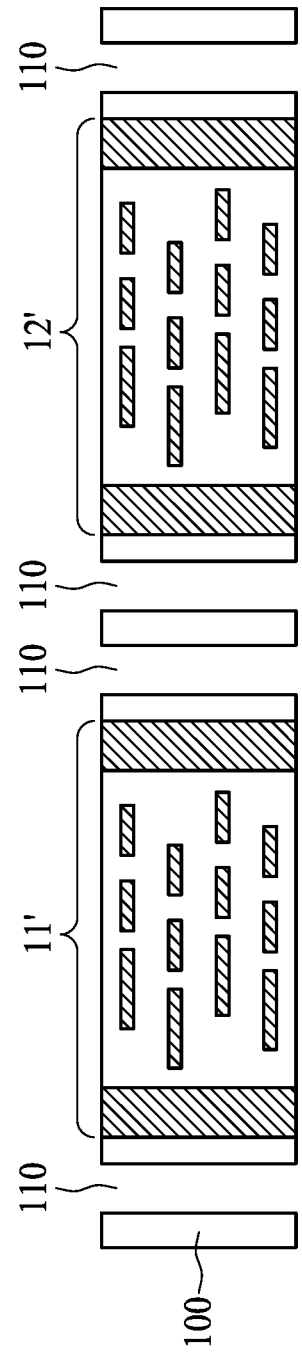

Referring to FIG. 12B, one or more through holes 110 are formed around the periphery of the substrate units 11' and 12', for example, by laser drilling.

Figure 12C:
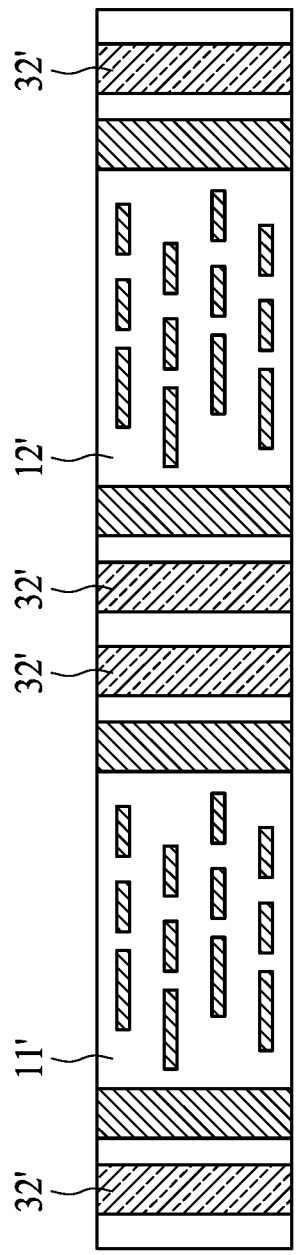

Referring to FIG. 12C, the through holes 110 are filled with solder material 32'.

Figure 12D:
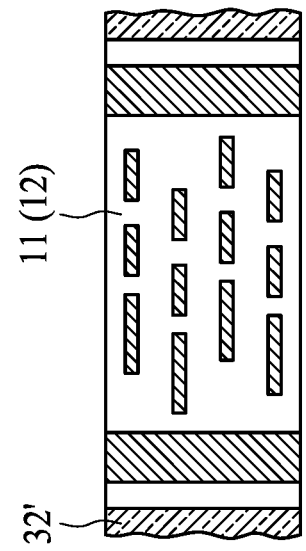

Referring to FIG. 12D, a singulation process is carried out, e.g., by laser dicing, along the periphery of the substrate units 11' and 12' and through the through holes 110 to singulate the substrate units 11' and 12'. After singulation, partitioned substrates 11 and 12 are formed and include a solder material 32' disposed within a vertical recess located at a lateral surface thereof. As illustrated in FIG. 12D, the solder material 32' may have a rough lateral surface after singulation.

Figure 12E:
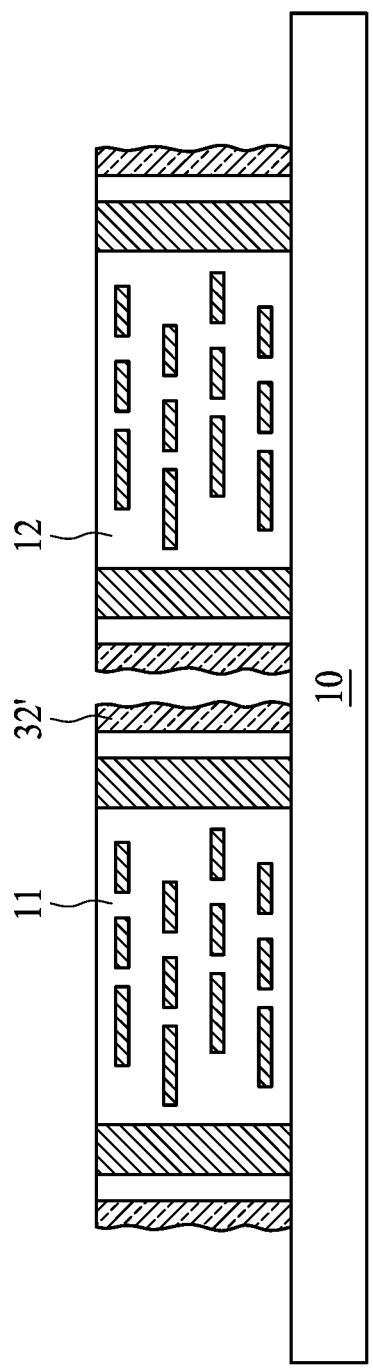

Referring to FIG. 12E, the partitioned substrates 11 and 12 is disposed side-by-side on a carrier 10.

Figure 12F:
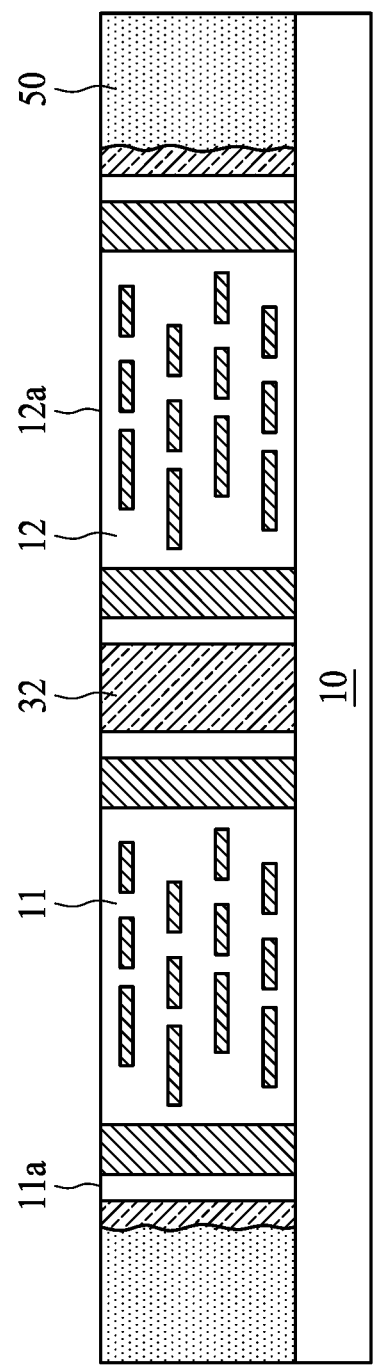

Referring to FIG. 12F, a reflow process is carried out to form a conductive bonding layer 32 from the solder material 32'. During the reflow process, the solder material 32' is melted, and since the distance between the partitioned substrates 11 and 12 can be controlled, the solder material 32' located at a lateral surface of the partitioned substrate 11 can be combine with the solder material 32' located at a lateral surface of the partitioned substrate 12 to form a conductive bonding layer 32. An encapsulant 50 is then formed on the carrier 10 and encapsulates the partitioned substrates 11 and 12. The encapsulant 50 may be ground to expose the surfaces 11a and 12a of the partitioned substrates 11 and 12.

Figure 12G:
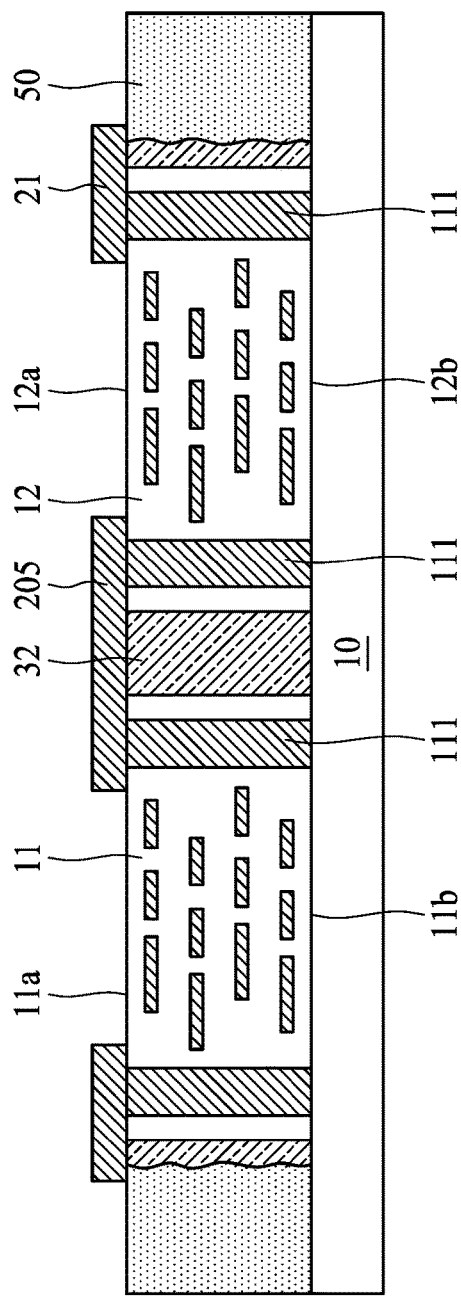

Referring to FIG. 12G, a patterned metal layer 21 is formed on the surface 11a of the partitioned substrate 11 and the surface 12a of the partitioned substrate 12. The patterned metal layer 21 includes a plurality of pads. In some embodiments, the patterned metal layer 21 is an redistribution layer (RDL) which includes conductive traces and a plurality of pads. The patterned metal layer 21 is referred to as a pad layer in the embodiments of the present disclosure.

The conductive vias 111 (or the pads or electrical contacts) exposed from the surface 11a of the partitioned substrate 11 and the surface 12a of the partitioned substrate 12 contact the pad layer 21. A pad 205 of the pad layer 21 contacts the second surfaces 11b and 12b of the first substrate 11 and the second substrate 12 to electrically connect the first substrate 11 to the second substrate 12. In some embodiments, an L/S of the surface 11a of the partitioned substrate 11 is less than an L/S of the surface 11b of the partitioned substrate 11 and an L/S of the surface 12a of the partitioned substrate 12 is less than an L/S of the surface 12b of the partitioned substrate 12.

FIG. 12A, FIG. 12B, FIG. 12C, FIG. 12D, FIG. 12H, FIG. 12I and FIG. 12J illustrate various stages of a method for manufacturing a semiconductor package structure 6 in accordance with some embodiments of the present disclosure.

Partitioned substrates 11 and 12 are prepared as discussed above with respect to FIG. 12A, FIG. 12B, FIG. 12C and FIG. 12D.

Figure 12H:
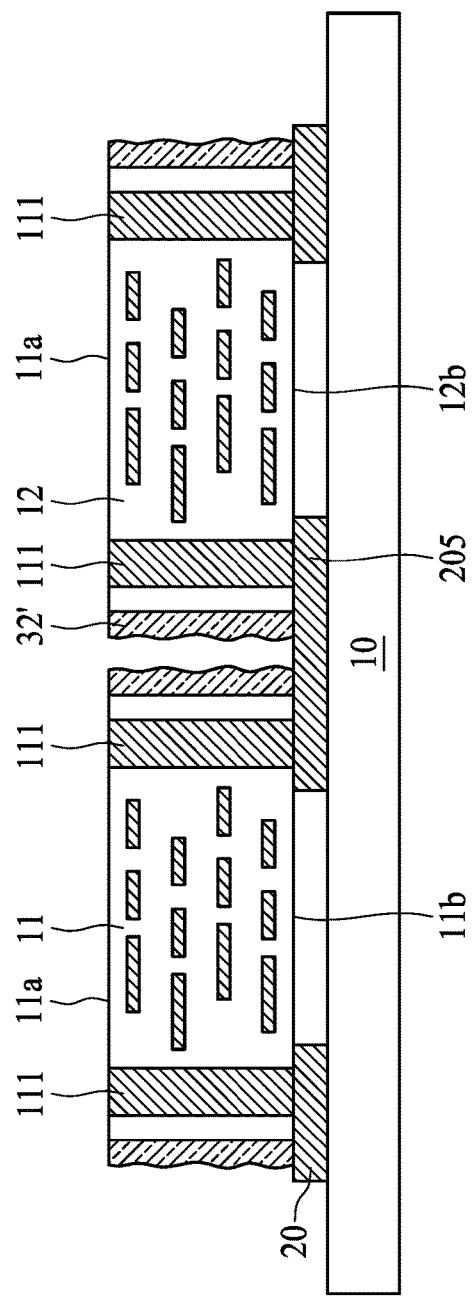

In FIG. 12H, a carrier 10 is provided and a pad layer 20 is formed on a carrier 10 as illustrated in FIG. 9A. The partitioned substrates 11 and 12 are disposed side-by-side on the pad layer 20. The conductive vias 111 (or the pads or electrical contacts) of the partitioned substrate 11 and the partitioned substrate 12 are in direct contact with the pad layer 20 where a pad 205 of the pad layer 20 is in direct contact with the surfaces 11b and 12b of the partitioned substrate 11 and the partitioned substrate 12 to electrically connect the partitioned substrate 11 to the partitioned substrate 12. In some embodiments, an L/S of the surface 11a of the partitioned substrate 11 is less than an L/S of the surface 11b of the partitioned substrate 11 and an L/S of the surface 12a of the partitioned substrate 12 is less than an L/S of the surface 12b of the partitioned substrate 12.

Figure 12I:
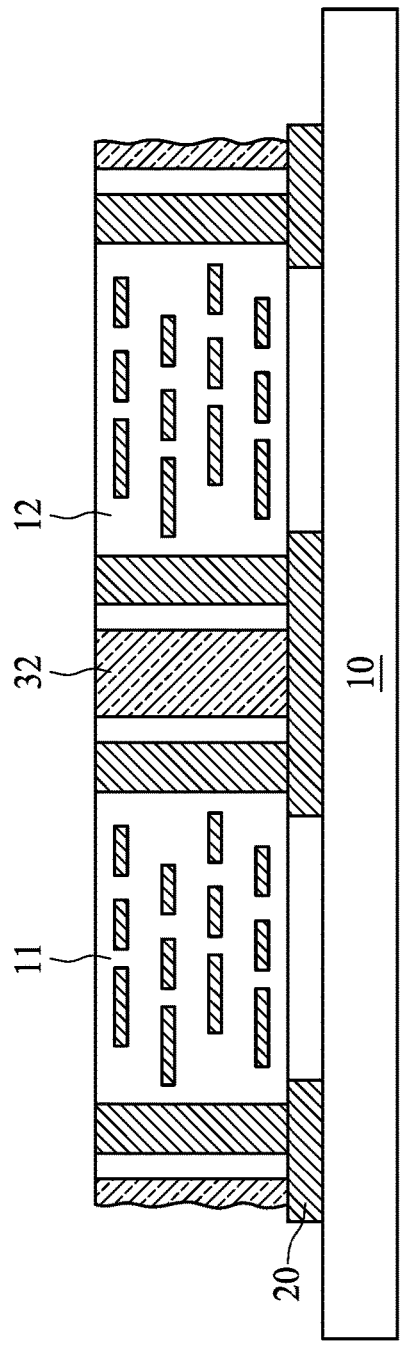

Referring to FIG. 12I, a reflow process is carried out to form a conductive bonding layer 32 from the solder material 32'. During the reflow process, the solder material 32' is melted, and since the distance between the partitioned substrates 11 and 12 can be controlled, the solder material 32' located at a lateral surface of the partitioned substrate 11 can be combine with the solder material 32' located at a lateral surface of the partitioned substrate 12 to form a conductive bonding layer 32.

Figure 12J:
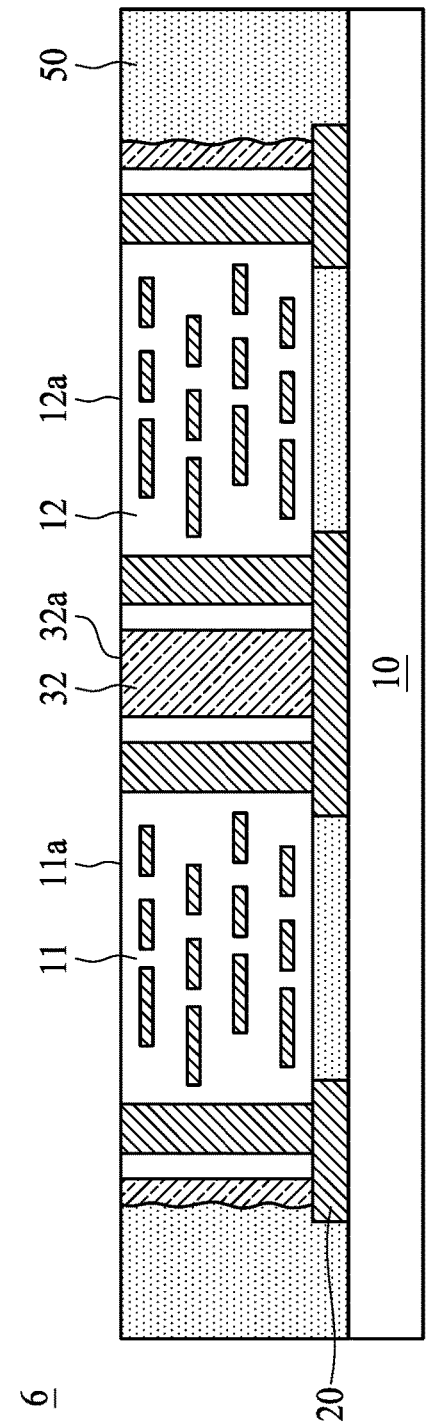

Referring to FIG. 12J, an encapsulant 50 is then formed on the carrier 10 and encapsulates the partitioned substrates 11 and 12 and the pad layer. The encapsulant 50 may be ground to expose the surfaces 11a and 12a of the partitioned substrates 11 and 12 and the surface 32a of the conductive bonding layer 32.

FIG. 13A, FIG. 13B, FIG. 13C, FIG. 13D, FIG. 13E and FIG. 13F illustrate various stages of a method for manufacturing a semiconductor package structure 8 in accordance with some embodiments of the present disclosure.

Figure 13A:
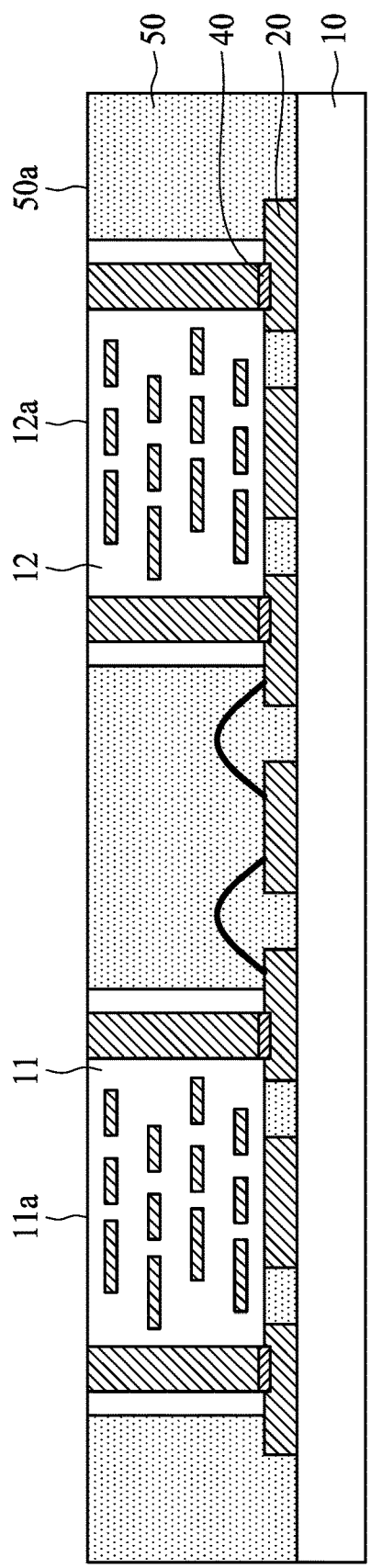
FIG. 13A, FIG. 13B, FIG. 13C, FIG. 13D, FIG. 13E and FIG. 13F illustrate various stages of a method for manufacturing a semiconductor package structure in accordance with some embodiments of the present disclosure.

Referring to FIG. 13A, a semiconductor package structure 5 is provided. Though the a semiconductor package structure 5 is illustrated in FIG. 13A, other semiconductor package structure, such as the semiconductor package structure 2, 3, 4 or 6 may be used.

Figure 13B:
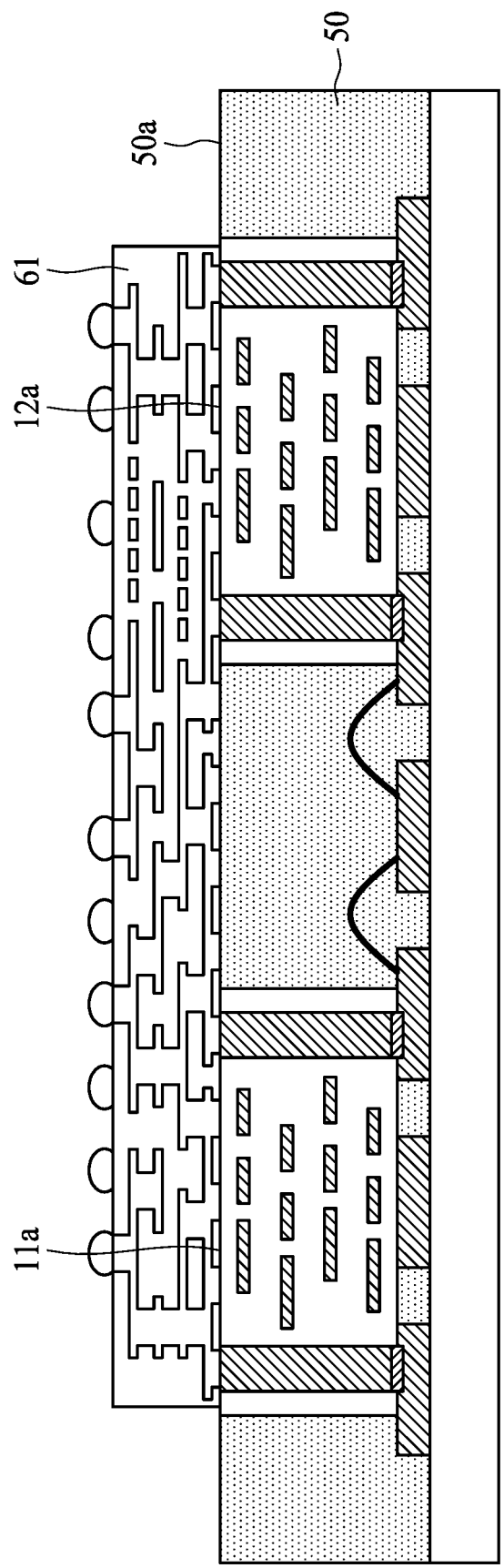

Referring to FIG. 13B, an RDL structure 61 is formed on the surface 11a of the substrate 11, the surface 12a of the substrate 12 and the surface 50a of the encapsulant 50.

Figure 13C:
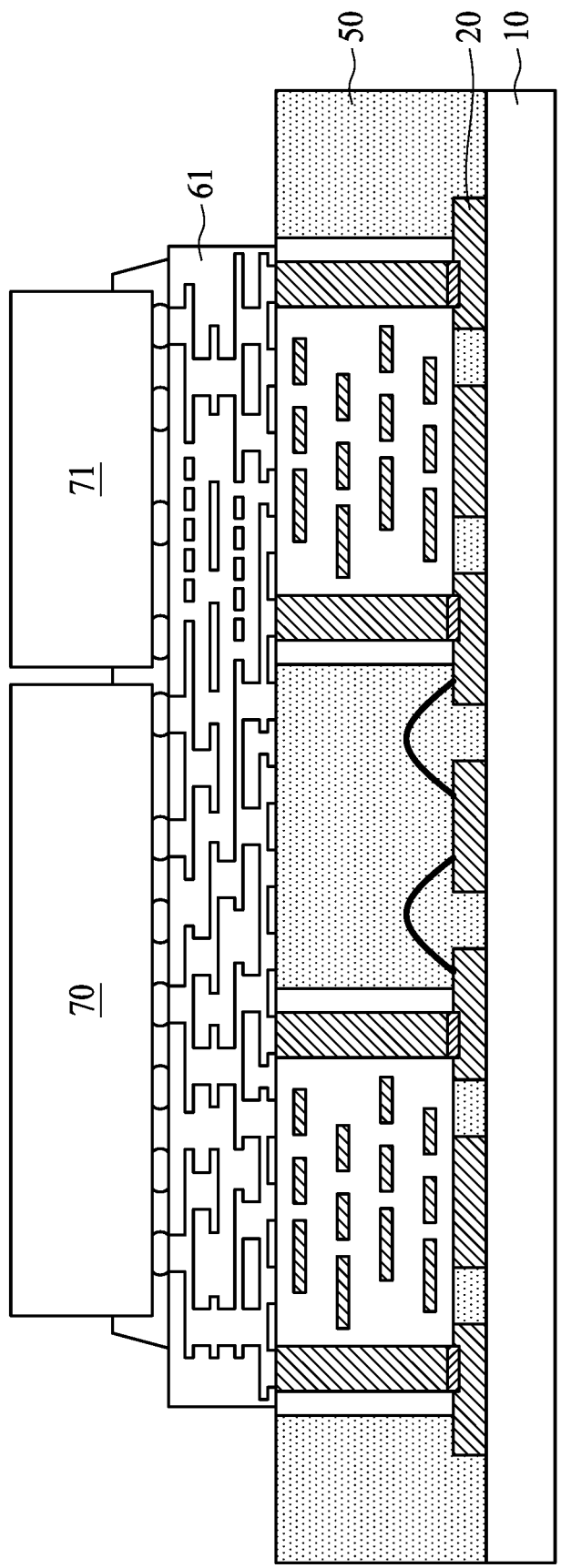

Referring to FIG. 13C, electronic devices 70 and 71 are disposed on the RDL structure 61.

Figure 13D:
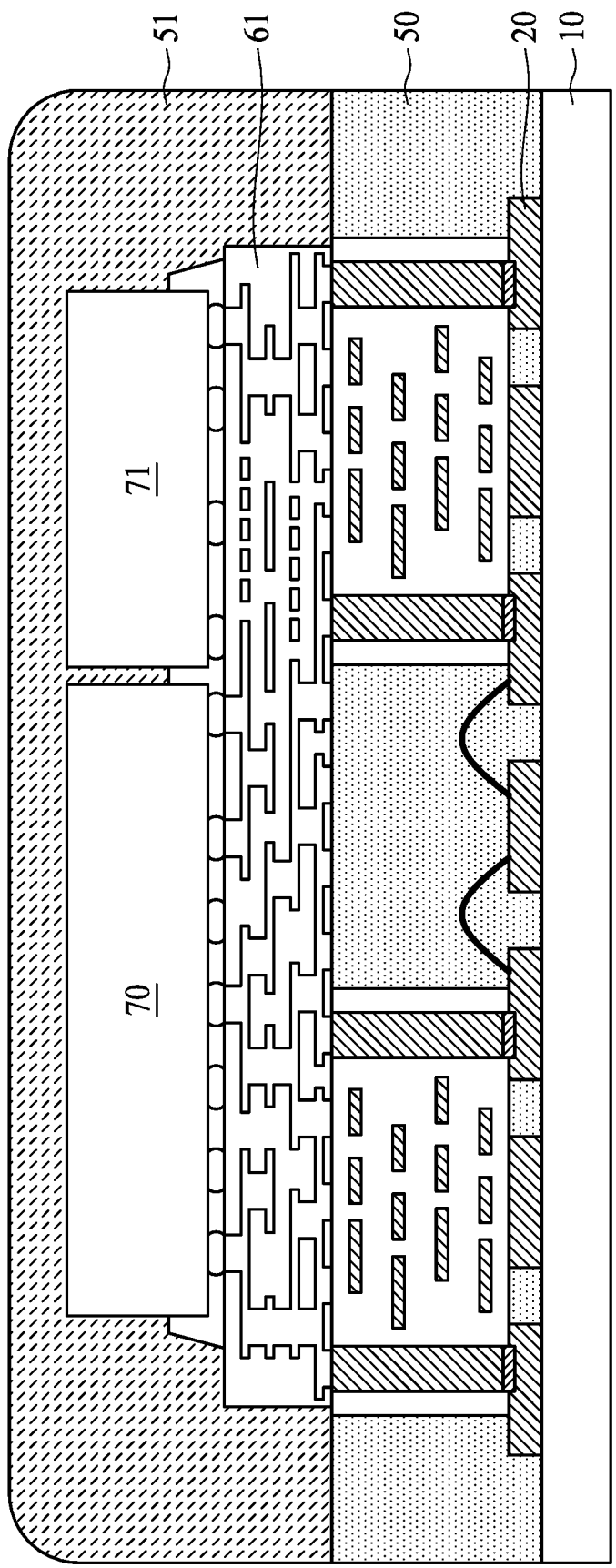
Figure 13E:
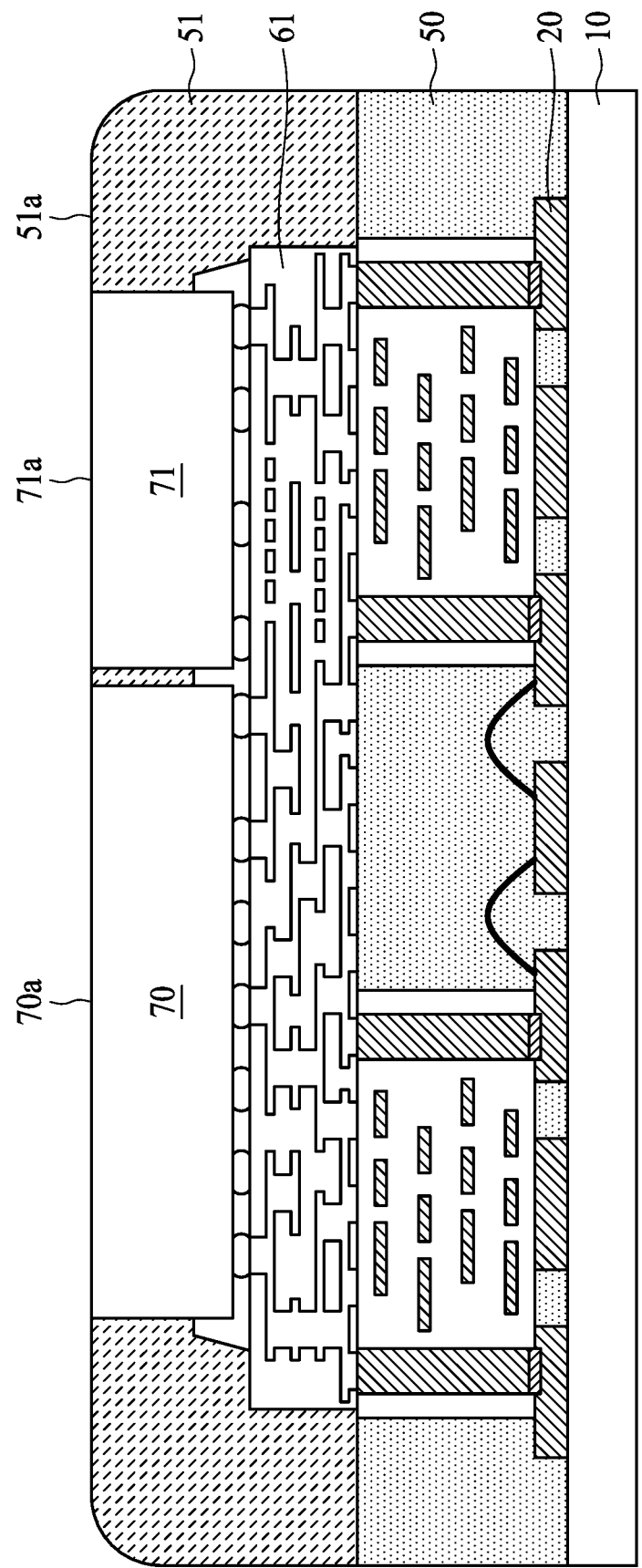

Referring to FIG. 13D, an encapsulant 51 is disposed on the structure made in FIG. 13C to encapsulate the RDL structure 61 and the electronic devices 70 and 71. The encapsulant 51 may contact the encapsulant 50. In some embodiments, the encapsulant 51 may be ground to expose the surface 70a of the electronic device 70 and the surface 71a of the electronic device 71 as illustrated in FIG. 13E.

Figure 13F:
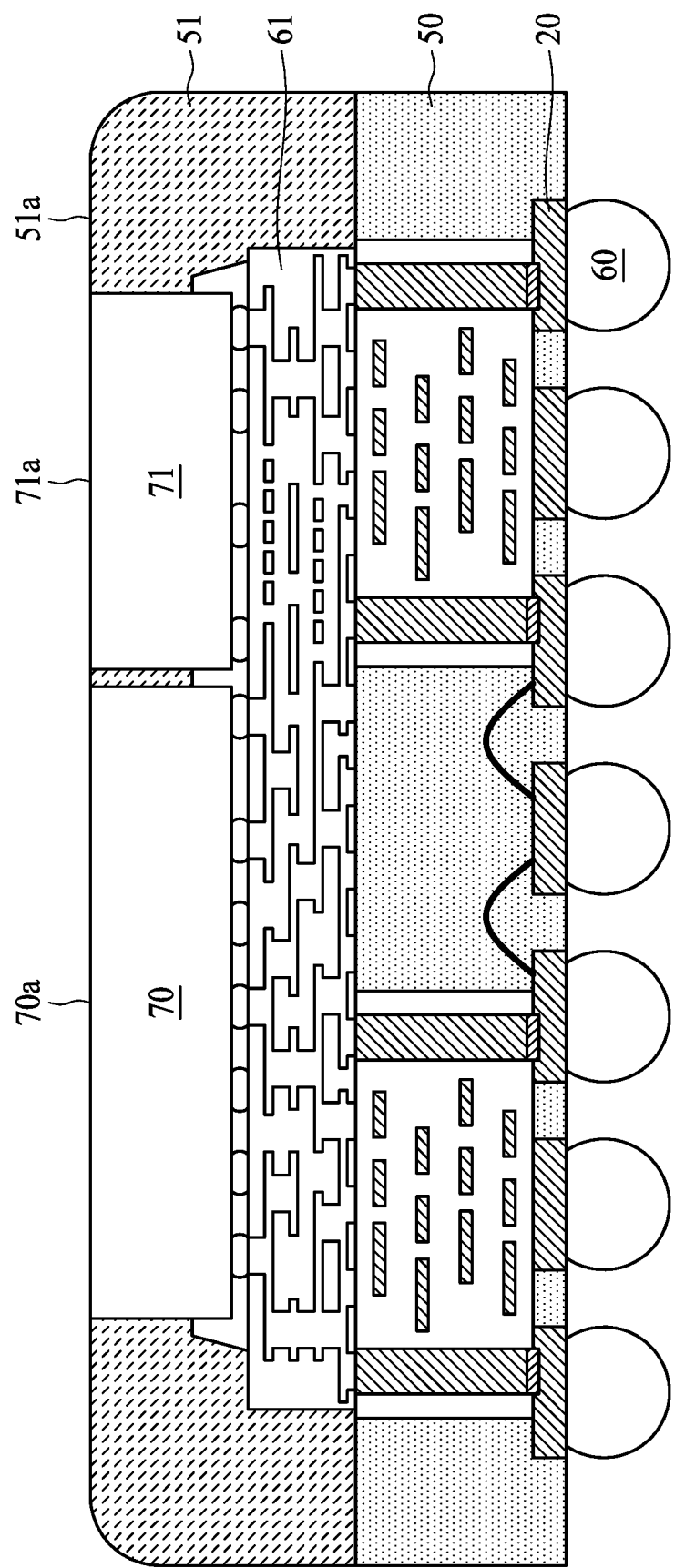

Referring to FIG. 13F, the carrier 10 is removed and solder balls 60 are bonded to respective pads of the pad layer 20.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, spatially relative terms, such as "above," "below," "up," "left," "right," "down," "top," "bottom," "vertical," "horizontal," "side," "higher," "lower," "upper," "over," "under" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the term "vertical" is used to refer to these upward and downward directions, whereas the term "horizontal" refers to directions transverse to the vertical directions.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between the highest point and the lowest point of the surface is no greater than 5 μm, no greater than 2 μm, no greater than 1 μm, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a first substrate having a first surface and a second surface opposite to the first surface;

a second substrate having a first surface and a second surface opposite to the first surface wherein the second substrate is disposed side-by-side with the first substrate; and a position-fixing structure connected to the first substrate and the second substrate, the position-fixing structure to mitigate position shifting of at least one of the first substrate and the second substrate due to filling of an encapsulant to cover the first substrate and the second substrate, wherein the position-fixing structure comprises a conductive bonding structure disposed along a lateral surface of the first substrate and wherein the conductive bonding structure comprises a first surface facing away the first substrate and comprising at least one concave structure recessed toward the first substrate.

2. The semiconductor package structure of claim 1, wherein the encapsulant encapsulates the first substrate, the second substrate and the position-fixing structure, and wherein the position-fixing structure comprises a pad layer, a portion of the encapsulant is disposed between a first pad and a second pad of the pad layer.

3. The semiconductor package structure of claim 1, wherein the at least one concave structure comprises two or more concave structures.

4. The semiconductor package structure of claim 1, wherein the position-fixing structure comprises a pad layer, the first surface of the conductive bonding structure further comprises a convex structure and a vertical projection of the convex structure falls within the pad layer.

5. The semiconductor package structure of claim 1, wherein the conductive bonding structure is covered by an encapsulant and partially exposed from the encapsulant.

6. A semiconductor package structure, comprising:
a first substrate comprising a through via;
a second substrate disposed side-by-side with the first substrate;
a conductive bonding layer;
a pad layer;
a wire, wherein the wire electrically connects a first pad and a second pad of the pad layer and is disposed between the first substrate and the second substrate,
wherein the through via and the pad layer are connected through the conductive bonding layer, a material of the pad layer is different from a material of the conductive bonding layer, and the material of the conductive bonding layer is different from a material of the through via.

7. The semiconductor package structure of claim 6, wherein the conductive bonding layer is disposed at an interface between the first substrate and the pad layer.

8. A semiconductor package structure, comprising:
a first substrate having a first surface and a second surface opposite to the first surface;
a second substrate having a first surface and a second surface opposite to the first surface wherein the second substrate is disposed side-by-side with the first substrate; and
a position-fixing structure connected to the first substrate and the second substrate, the position-fixing structure to mitigate position shifting of at least one of the first substrate and the second substrate due to filling of an encapsulant to cover the first substrate and the second substrate,
wherein the position-fixing structure comprises a conductive bonding structure disposed between a first lateral surface of the first substrate and a second lateral surface of the second substrate facing the first lateral surface.

* * * * *